(12) United States Patent
Yamaguchi et al.

(10) Patent No.: US 6,358,783 B1
(45) Date of Patent: Mar. 19, 2002

(54) SEMICONDUCTOR DEVICE AND METHOD OF MANUFACTURING THE SAME

(75) Inventors: Yasuo Yamaguchi; Tadashi Nishimura, both of Hyogo-ken (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/233,212

(22) Filed: Jan. 20, 1999

Related U.S. Application Data

(62) Division of application No. 08/098,251, filed on Jul. 29, 1993, now abandoned, which is a continuation of application No. 07/783,674, filed on Oct. 29, 1991, now abandoned.

(30) Foreign Application Priority Data

Nov. 19, 1990  (JP) .............................................. 2-314544

(51) Int. Cl.[7] .............................................. H01L 21/00
(52) U.S. Cl. ........................ 438/163; 438/104; 438/302; 438/525
(58) Field of Search ................................. 438/163, 104, 438/302, 525

(56) References Cited

U.S. PATENT DOCUMENTS

| | | |
|---|---|---|
| 4,087,902 A | 5/1978 | Feltner |
| 4,649,629 A * | 3/1987 | Miller et al. |
| 4,922,315 A | 5/1990 | Vu |
| 5,040,037 A | 8/1991 | Yamaguchi et al. |
| 5,051,808 A | 9/1991 | Saito et al. |
| 5,102,809 A | 4/1992 | Eklund et al. |
| 5,125,007 A | 6/1992 | Yamaguchi et al. |
| 5,158,903 A * | 10/1992 | Hori et al. |
| 5,241,211 A * | 8/1993 | Tashiro |
| 5,733,792 A * | 3/1998 | Masuoka |

FOREIGN PATENT DOCUMENTS

| | | |
|---|---|---|
| EP | 0 373 893 A3 | 6/1990 |
| JP | 60-133756 | 7/1985 |
| JP | 61-104671 | 5/1986 |
| JP | 62-76776 | 4/1987 |
| JP | 2-27772 | 1/1990 |
| JP | 2-159767 | 6/1990 |
| JP | 2-280371 | 11/1990 |

OTHER PUBLICATIONS

S. Wolf, Silicon Processing for the VLSI Era, V2–Process Integration, pp. 66–70, 72–75, 1990.*

(List continued on next page.)

Primary Examiner—Long Pham
Assistant Examiner—S. A Brairton
(74) Attorney, Agent, or Firm—McDermott, Will & Emery

(57) ABSTRACT

A semiconductor device includes a MOS-type field effect transistor (SOI-MOSFET) formed on a thin silicon layer on an insulator layer. The SOI-MOSFET has a gate overlap-type LDD structure in which additional source/drain regions having an impurity concentration of $3 \times 10^{17}$ to $3 \times 10^{18}/cm^3$ overlapping with a gate electrode are provided in the silicon layer. According to this structure, when the SOI-MOSFET is on operation, only the additional source/drain regions are depleted, so that it is possible to obtain satisfactory transistor characteristics. Additional source/drain regions in this structure are formed by combination of vertical ion implantation using the gate electrode as a mask and thermal diffusion or oblique ion implantation using the gate electrode as a mask.

15 Claims, 11 Drawing Sheets

OTHER PUBLICATIONS

Sanchez et al., Drain–Engineered Hot–Electron–Resistant Device Structures: A Review, (IEEE) 1989, pp. 1125–1133.*

A New Submicron MOSFET with LATID (Large–Tilt–Angle Implanted Drain) Structure, Takashi Hori et al, pp. 15–16.

"Current Status of Ion Implantation of VLSI Applications", Yoichi Akasaka, Nuclear Instruments and Methods in Physics Research, B37/38, Feb. 1989, No. 2, pp. 9–15.

Thin–Film SOI Technology: The Solution to Many Submicron CMOS Problems, IEDM, 1989, pp. 817–820.

"Half–Micron CMOS on Ultra–Thin Silicon on Insulator", IEDM, 1989, pp. 821–824.

"A High Performance and Highly Reliable Dual Gate CMOS with Gate/N Overlapped LDD Applicable to the Cryogenic Operation", IEDM, 1989, pp. 773–776.

* cited by examiner

SEMICONDUCTOR DEVICE AND METHOD OF MANUFACTURING THE SAME

This application is a divisional of application Ser. No. 08/098,251 filed Jul. 29, 1993 now abandoned, which is a continuation of application Ser. No. 07/783,674 filed Oct. 29, 1991 now abandoned.

BACKGROUND OF THE INVENTION

1. Field of the Invention

The present invention relates to a semiconductor device including a MOS (Metal Oxide Semiconductor) field effect transistor (hereinafter referred to as "SOI-MOSFET") formed in a semiconductor layer on an insulator such as an insulator substrate and a method of manufacturing the same, and, more particularly, to a technique for improving withstand voltage and current driving characteristics between source and drain regions.

2. Description of the Background Art

FIG. 1 is a sectional view of a SOI-MOSFET as a first conventional example. Referring to FIG. 1, the SOI-MOSFET includes an insulator layer 2 formed on a silicon substrate 1 and a silicon layer 3 formed on insulator layer 2. A channel forming region 6 having a low concentration of p-type impurities ($10^{16}$–$10^{17}$/cm$^3$, for example) is formed in silicon layer 3, and an additional source region 7a and an additional drain region 8a having a concentration of n-type impurities ($10^{17}$–$10^{18}$/cm$^3$, for example) are formed respectively in contact with the left and right sides of channel forming region 6. A source region 7b and a drain region 8b having a high concentration of n-type impurities concentration ($10^{19}$–$10^{21}$//cm$^3$, for example) are formed respectively adjacent to additional source region 7a and additional drain region 8a.

A gate insulating film 4 is formed on channel forming region 6, and a gate electrode 5 is formed on gate insulating film 4. Sidewalls 13 are provided on the sidewalls of gate electrode 5 on additional source region 7a and additional drain region 8a. Silicon layer 3 and gate electrode 5 are covered with an interlayer insulating film 9. Contact holes 10a, 10b are provided in interlayer insulating film 9, and corresponding conductors, i.e. a source electrode 11 and a drain electrode 12 in this case, are formed in respective contact holes 10a, 10b.

If positive voltage is applied to gate electrode 5 in a SOI-MOSFET constituted as described above, n-type carriers (electrons) are induced to the upper part of p-type channel forming region 6, and the upper part is inverted to be the same n-type as additional source region 7a, additional drain region 8a, source region 7b, and drain region 8b. Accordingly, current can flow between source region 7b and drain region 8b. In addition, the concentration of the n-type carriers induced to upper part of channel forming region 6 changes in accordance with the gate voltage, so that it is possible to control the current flowing in channel forming region 6 with the gate voltage. This is the operation principle of the MOSFET.

The reason why additional source region 7a and additional drain region 8a were formed respectively adjacent to source region 7b and drain region 8b in the first conventional thin film SOI-MOSFET having the above-described structure is as described in the following.

In a case where it is a thin film SOI-MOSFET having silicon layer 3 of approximately 300 Å–1500 Å, even if additional source region 7a and additional drain region 8a are not formed, the whole of channel forming region 6 is easily made to be a depletion layer by applying voltage to gate electrode 5, and the potential of the channel forming region is also controlled by the gate electrode, so that so-called punch through or short channel effect is reduced. Here, "punch through" is a phenomenon that a depletion layer extending from drain region 8b into channel forming region 6 reaches to source region 7b, the electric barrier between source region 7b and channel 6 is lowered, and the channel current is suddenly increased by it. "Short channel effect" is a phenomenon that when the gate length is short, the gate threshold voltage becomes extremely low.

However, if the whole of channel forming region 6 is completely depleted, the potential in channel forming region 6 becomes higher than that in the case of a conventional bulk MOSFET. Accordingly, the electric barrier between source region 7b and channel forming region 6 is lowered, and holes generated by so-called impact ionization, a phenomenon that highly accelerated electrons collide with a lattice in the vicinity of drain region 8b and cause electrons and holes to be generated, come to be temporarily stored in channel forming region 6. As a result, the potential in channel forming region 6 is further raised, and electrons are suddenly injected from source region 7b into channel forming region 6. Specifically, in a case where additional source region 7a and additional drain region 8a are not formed in a thin film SOI-MOSFET expected as a short channel MOSFET, the withstand voltage between the source and the drain tends to be lowered. FIG. 4A shows the drain current—drain voltage characteristics of the thin film SOI-MOSFET in this case.

In order to prevent such lowering of the withstand voltage between the source and the drain, a so-called LDD (Lightly Doped Drain) structure is constituted by providing a low second conductivity-type additional drain region 8a between drain region 8b and channel forming region 6 in a normal thin film SOI-MOSFET such as the first conventional example described above to reduce the electric field in the vicinity of drain region 8b and prevent storage of holes caused by impact ionization so that the withstand voltage between the source and the drain is enhanced. Now, a method of manufacturing the above-described first conventional thin film SOI-MOSFET will be described with reference to FIGS. 2A–2E.

First, referring to FIG. 2A, a silicon layer 3 is formed on a silicon substrate 1 with an insulator layer 2 interposed therebetween. Specific manufacturing methods in this case normally include SIMOX (Separation by Implanted Oxygen) in which oxygen ions are implanted in silicon substrate 1 and a silicon oxide film is formed directly in silicon substrate 1.

Next, silicon layer 3 is patterned into a shape of an island, and p-type impurities such as boron are introduced by an ion implantation process or the like to make the concentration $10^{16}$–$10^{17}$/cm$^3$, for example, to form a channel forming region 6 (FIG. 2B).

A gate insulating film 4 is formed on silicon layer 3 by a thermal oxidation process or the like, and a gate electrode material such as polycrystalline silicon is deposited by a CVD method. A resist 14 is patterned on the polycrystalline silicon by a photolithography process, and the polycrystalline silicon is etched using the resist 14 to form a gate electrode 5.

Next, n-type impurities such as phosphorus are introduced into silicon layer 3 using gate electrode 5 and resist 14 as a mask to make the concentration $10^{17}$–$10^{18}$/cm$^3$ to form an additional source region 7a and an additional drain region 8a (FIG. 2C).

Next, a silicon oxide film 13a is deposited by a CVD method (FIG. 2D), anisotropic etching is carried out on silicon oxide film 13a by a reactive ion etching process to form a sidewall spacer 13 on the sidewalls of gate electrode 5. Next, n-type impurities such as phosphorus or arsenic are ion-implanted in silicon layer 3 using gate electrode 5 and sidewall spacer 13 as a mask, and a source region 7b and a drain region 8b are formed to have a concentration of $10^{19}$–$10^{21}$/cm$^3$, for example (FIG. 2E).

An interlayer insulating film 9 is formed, then contact holes 10a, 10b are formed by a reactive ion etching process, for example, and conductive interconnection layers 11, 12 including aluminum or the like are formed to complete the structure illustrated in FIG. 1.

As described above, the above first conventional thin film SOI-MOSFET has the concentration of additional source region 7a and additional drain region 8a lowered to approximately $10^{17}$/cm$^3$ in order to enhance the withstand voltage between the source and the drain by electric field reduction. Therefore, the carrier concentration is lowered, the resistance of additional source region 7a and additional drain region 8a is increased, and a significant decline in the current driving capability is caused as shown in FIG. 4B.

Japanese Patent Laying-Open No. 60-133756 (1985) discloses a thin film SOI-MOSFET having a so-called gate overlap type LDD structure (hereinafter referred to as "a second conventional example"), for example, for improving the problems in the first conventional example.

A thin film SOI-MOSFET of the second conventional example has low concentration impurity regions, which are additional source/drain regions, overlapped with the region of a gate electrode. This causes the gate voltage to be directly applied to the additional source/drain regions, so that it is possible to raise the carrier concentration of the additional source/drain regions at the same time that the conductivity type of the channel forming region is inverted when the MOSFET is on operation. Accordingly, it is possible to prevent deterioration of the current driving characteristics caused by increase of the resistance value of the additional source/drain regions having a low concentration.

Now, a method of manufacturing the thin film SOI-MOSFET of the second conventional example will be described with reference to FIGS. 3A to 3E.

First, referring to FIG. 3A, an insulator layer 22 is formed on an insulating substrate 21, and then a semiconductor layer 23 is formed.

Next, referring to FIG. 3B, semiconductor layer 23 is patterned, and then a gate insulating layer 24 is formed. Then, referring to FIG. 3C, a gate electrode 25 having the resistance reduced by thermal diffusion of impurities or the like is formed, and then a resist layer 26 is etched so that it has the same width as the channel width and has a length shorter than the channel length by several percent as illustrated in FIG. 3C to form a mask for ion implantation as illustrated in FIG. 3C.

Next, referring to FIG. 3D, ion implantation is carried out by irradiating impurity ions 27 using resist layer 26 as a mask, and then heat treatment is carried out to activate the impurities.

Then, referring to FIG. 3E, resist layer 26 is removed, and an interlayer insulating layer 28 is formed. Contact holes are formed, and then electrodes 29 are formed. The concentration of an additional source/drain region 30 formed by ion implantation is lower than that of the region of a source/drain region 31 adjacent to it; This is because implantation of impurity ions into additional source/drain region 30 is carried out through gate electrode 25, so that the amount of the implanted ions is reduced in accordance with effects of the thickness of gate electrode 25.

However, according to the manufacturing method as described in the above second conventional example, ion implantation for forming additional source/drain region 30 is carried out through gate electrode 25, so that a step of forming resist layer 26 is required, and the process becomes complicated. In addition, the concentration of additional source/drain region 30 is controlled by the thickness of gate electrode 25, so that it is liable to be affected by diversification of the thickness or the material of gate electrode 25. In the case of a thin film SOI-MOSFET of a LDD structure having an additional source/drain region overlapping with gate electrode 25, it is necessary to set the concentration of the additional source/drain region to a value in a certain limited range with high precision in order to obtain satisfactory transistor characteristics. However, there was no disclosure of a concentration setting in the above second conventional example, and fine control of the concentration of the additional source/drain region was difficult.

SUMMARY OF THE INVENTION

One object of the present invention is to provide a semiconductor device including a gate overlap-type thin film SOI-MOSFET having an optimum concentration of an additional source/drain region for having satisfactory transistor characteristics and a method of manufacturing the same.

In order to solve the above described problems, a semiconductor device according to the present invention includes a semiconductor layer having a thickness of 300 Å to 1500 Å formed on an insulator layer and a gate electrode formed on the semiconductor layer with a gate insulating film interposed therebetween. A pair of additional source/drain regions of a first conductivity type is formed from immediately beneath both of right and left side ends of the gate electrode inward in the semiconductor layer in the region immediately beneath the gate electrode, and a channel forming region of a second conductivity type is formed in the semiconductor layer in a region between the pair of additional source/drain regions. Further, a pair of source/drain regions of the first conductivity type is formed adjacent to the end opposite the side in contact with the channel forming region of the additional source/drain regions in the semiconductor device.

The additional source/drain regions in the semiconductor device have an impurity concentration of $3 \times 10^{17}$ to $3 \times 10^{18}$/cm$^3$, and the source/drain region has an impurity concentration higher than that of the additional source/drain regions.

According to the semiconductor device of the present invention, gate overlap-type additional source/drain regions are included, and the concentration is set to $3 \times 10^{17}$–$3 \times 10^{18}$/cm$^3$, so that it has functions as described in the following.

In a case where the gate electrode is 0V, and a predetermined positive bias voltage is applied to the drain region, substantially only the whole of additional source/drain regions is depleted because the additional source/drain regions are set to have a concentration of $3 \times 10^{18}$/cm$^3$ or less. As a result, the electric field strength reduction effect is larger as compared to the case where the concentration of the additional source/drain regions is too high to sufficiently deplete the additional source/drain regions or the case where the concentration is so low as to cause depletion to proceed up to the adjacent source/drain regions. Further, it also has effects unique to a gate overlap structure, so that satisfactory transistor characteristics can be obtained. If the concentration of the additional source/drain region is set to less than $3 \times 10^{17}$, the parasitic resistance thereof affects the properties of the device.

According to a method of manufacturing a semiconductor device of the present invention, first, a gate insulating film is formed on a semiconductor layer on an insulator layer, and a gate electrode is formed on the gate insulating film. Next, impurities of a first conductivity type are introduced just beneath the vicinity of the ends of the gate electrode in the semiconductor layer by implanting the impurities from a predetermined direction making a predetermined angle of inclination with the surface of the semiconductor layer using the gate electrode as a mask to form additional source/drain regions. Subsequently, impurities of the first conductivity type are implanted from a direction perpendicular to the surface of the semiconductor layer onto the semiconductor layer using the gate electrode as a mask to form source/drain regions.

According to the above-described manufacturing method, the additional source/drain regions are formed by ion implantation using only the gate electrode as a mask, so that it is not necessary to separately pattern the mask as in the above second conventional example, and the manufacturing process is simplified.

According to another aspect of the method of manufacturing a semiconductor device of the present invention, the step of forming the additional source/drain regions is carried out by forming a gate electrode on the gate insulating film, then introducing impurities of a first conductivity type by ion implantation using the gate electrode as a mask, and then diffusing the impurities beneath the gate electrode by predetermined heat treatment.

According to this manufacturing method, formation of the additional source/drain regions is carried out by oblique ion implantation using the gate electrode as a mask, so that it is possible to set the length of the overlap of the additional source/drain regions with the gate electrode or the impurity concentration with higher precision as compared to the case where it is carried out by thermal diffusion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in the following with reference to the drawings.

Figure 1:
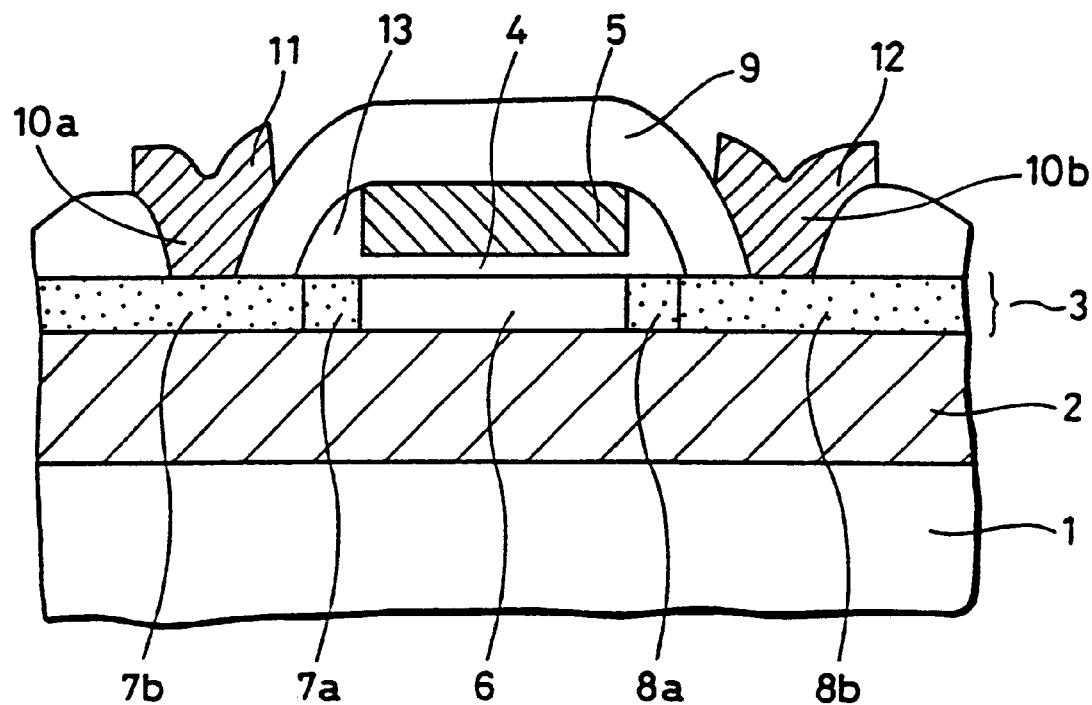
FIG. 1 is a sectional view illustrating a sectional structure of a thin film SOI-MOSFET in a first conventional example.
Figure 2A:
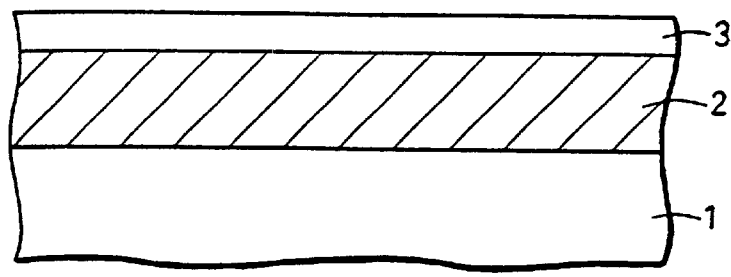
FIGS. 2A, 2B, 2C, 2D and 2E are sectional views illustrating in sequence main steps of the method of manufacturing the semiconductor device in the first conventional example.
Figure 2B:
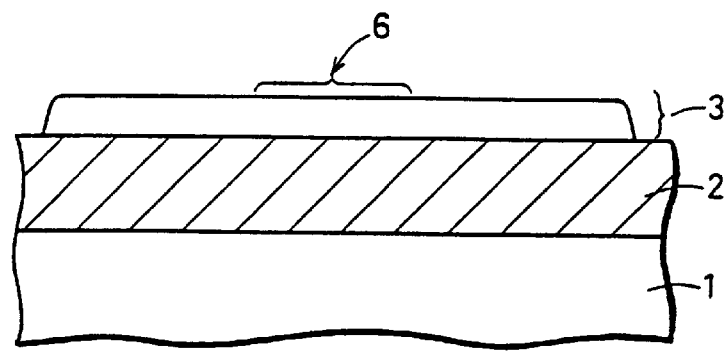
Figure 2C:
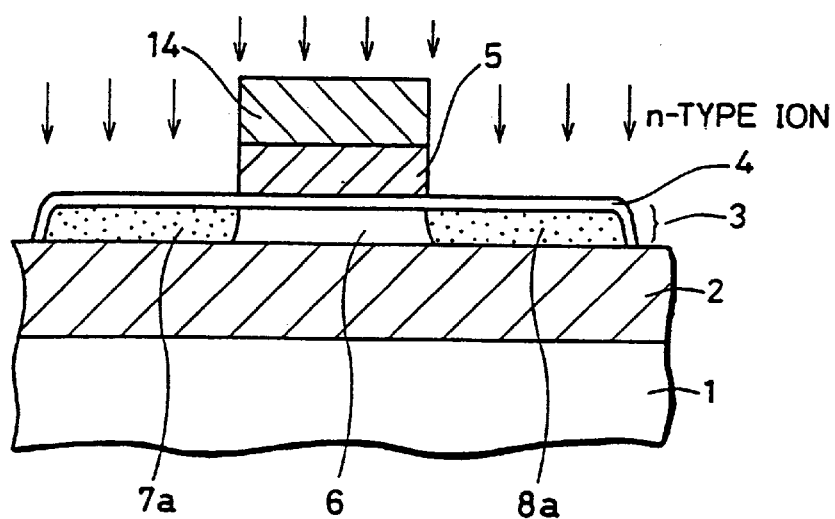
Figure 2D:
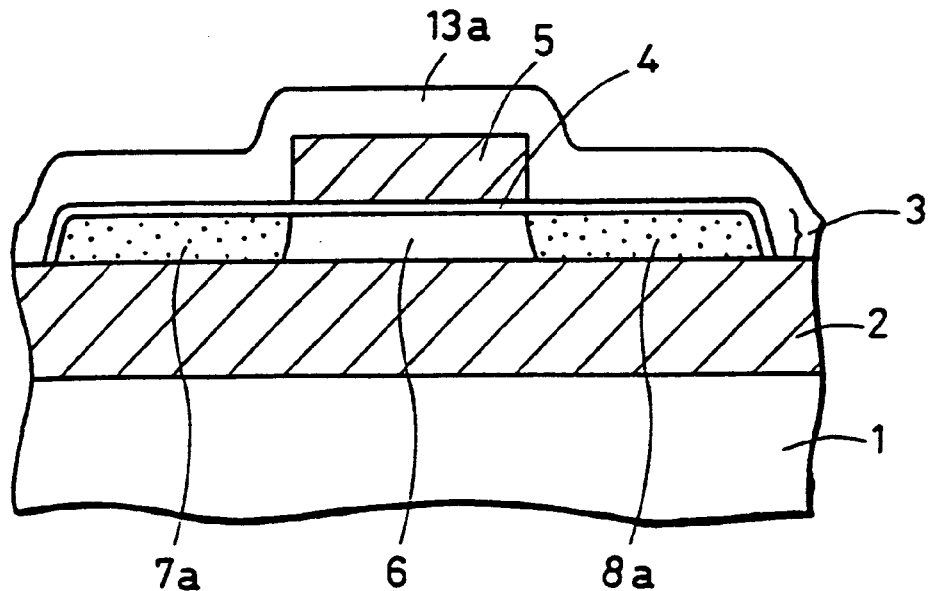
Figure 2E:
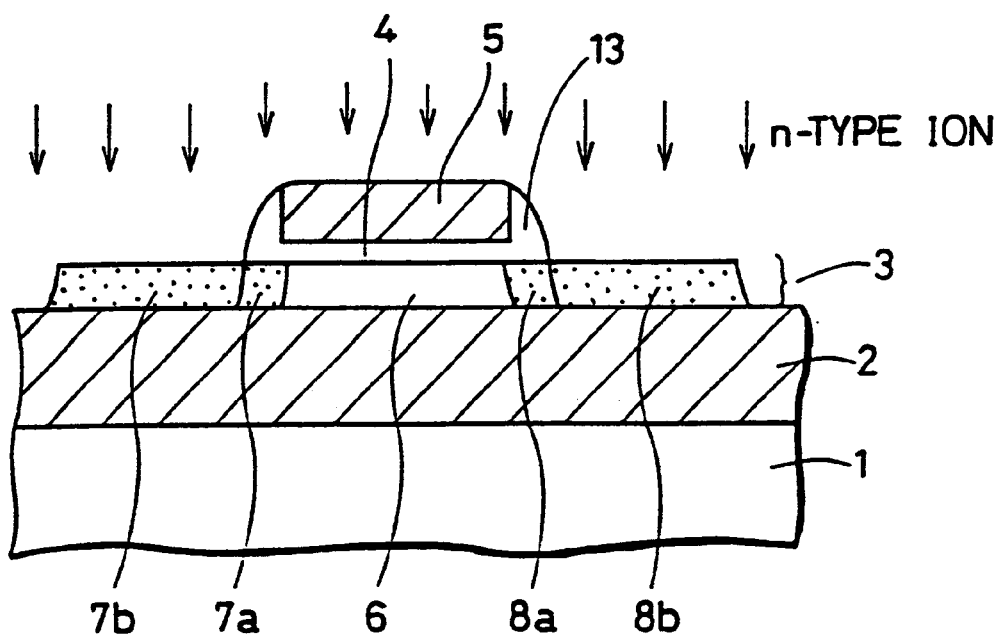
Figure 3A:
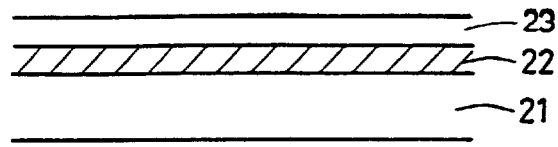
FIGS. 3A, 3B, 3C, 3D and 3E are sectional views illustrating in sequence a process of manufacturing a semiconductor device in a second conventional example.
Figure 3B:
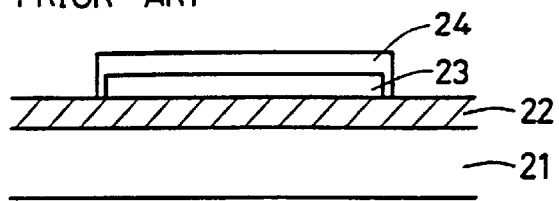
Figure 3C:
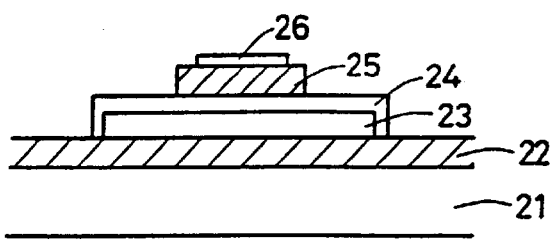
Figure 3D:
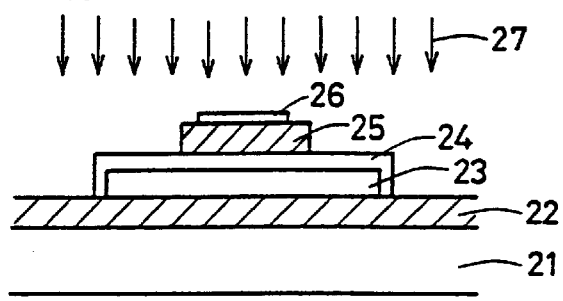
Figure 3E:
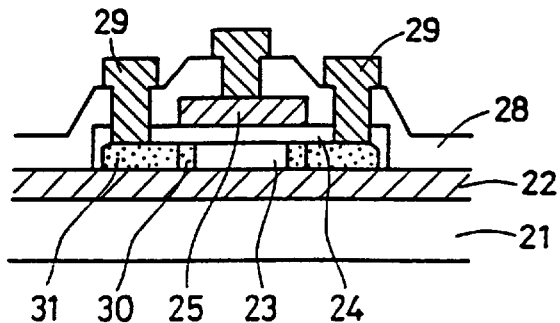
Figure 4A:
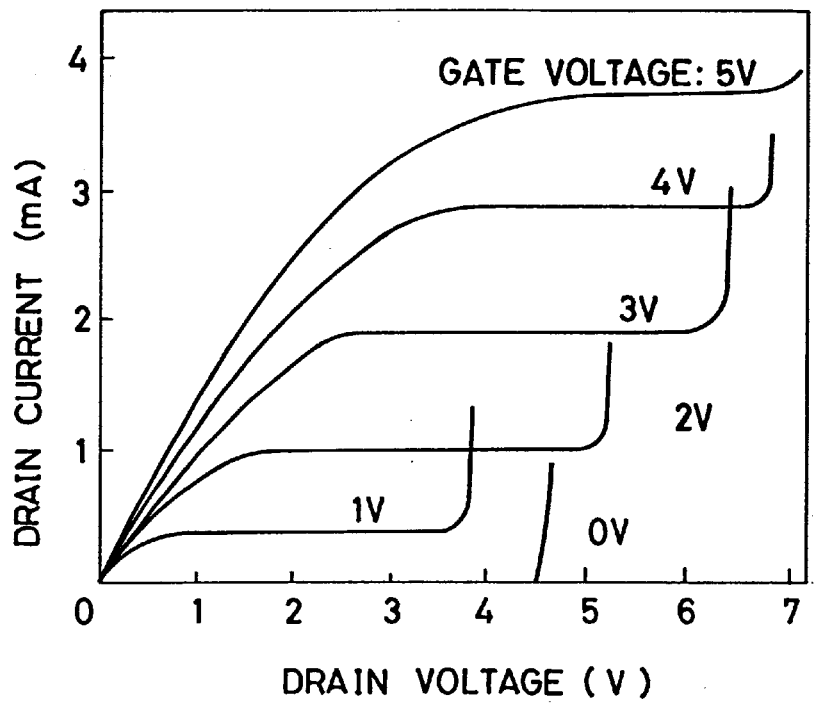
FIG. 4A is a graph showing the source/drain withstand voltage characteristics of a thin film SOI-MOSFET not having a LDD structure.
Figure 4B:
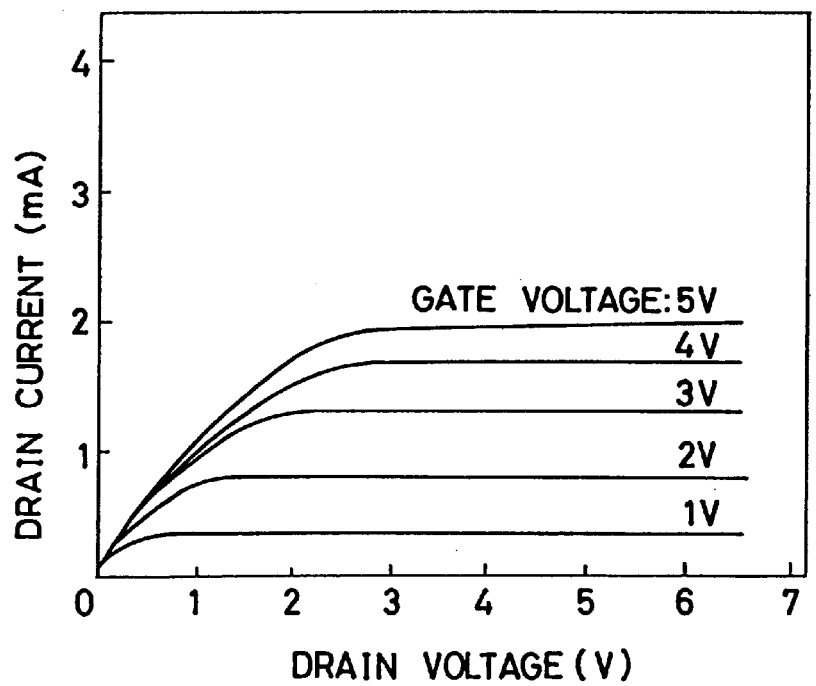
FIG. 4B is a graph showing the current characteristics of a LDD-type thin film SOI-MOSFET not having a gate overlap structure in the first conventional example.

The structure of a semiconductor device including a thin film SOI-MOSFET according to an embodiment of the present invention is substantially the same as that of the semiconductor device of the second conventional example illustrated in FIG. 3E. Specifically, referring to FIG. 5E, an insulator layer 2 is formed on a silicon substrate 1, and a silicon layer 3 is formed on insulator layer.2. A channel forming region 6 having a low concentration of p-type impurities ($10^{16}$–$10^{17}$/cm$^3$, for example) is formed in silicon layer 3. n-type additional source region 7a and additional drain region 8a are formed overlapping with the vicinity of both of right and left ends of a gate electrode 5 in silicon layer 3 which is in contact with both of left and right sides of channel forming region 6. n-type source region 7b and drain region 8b having an impurity concentration higher than that of additional source region 7a and additional drain region 8a are formed in silicon layer 3 adjacent to the ends opposite channel forming region 6 of additional source region 7a and additional drain region 8a.

The structure of the semiconductor device according to the present invention differs from the above-described second conventional example in that the concentration of additional source region 7a, and additional drain region 8a is set in the optimum range in accordance with the thickness of silicon layer 3. Specifically, according to this embodiment, it is a thin film SOI-MOSFET including silicon layer 3 having a thickness of 300–1500 Å, and the concentration of additional source region 7a and additional drain region 8a is set in the range of $3 \times 10^{17}$–$3 \times 10^{18}$/cm$^3$.

The reason why the concentration of additional source region 7a and additional drain region 8a is set in the above-described range in this embodiment will be described in the following.

The relationship between the concentration of additional drain region 8a and the withstand voltage between the source and the drain is considered as described in the following with reference to FIGS. 7A to 7C, 8 and 9. When the MOSFET is in the non-operation state, i.e. when a positive bias is applied to drain region 8b and the gate electrode is 0V, additional drain region 8a is depleted. If the concentration of additional drain region 8a is lower than a predetermined value of approximately $10^{18}/cm^3$, depletion proceeds up to drain region 8b as indicated by oblique lines in FIG. 7A, and a peak of high electric field strength occurs in the vicinity of the boundary between additional drain region 8a and drain region 8b as indicated by arrow A in FIG. 9. The reason for this is considered to be that if the concentration of additional drain region 8a is too low, the effects of the region as a drain are lessened, and it is brought to a state substantially the same as the state in which the drain is moved to the right side.

Figure 7A:
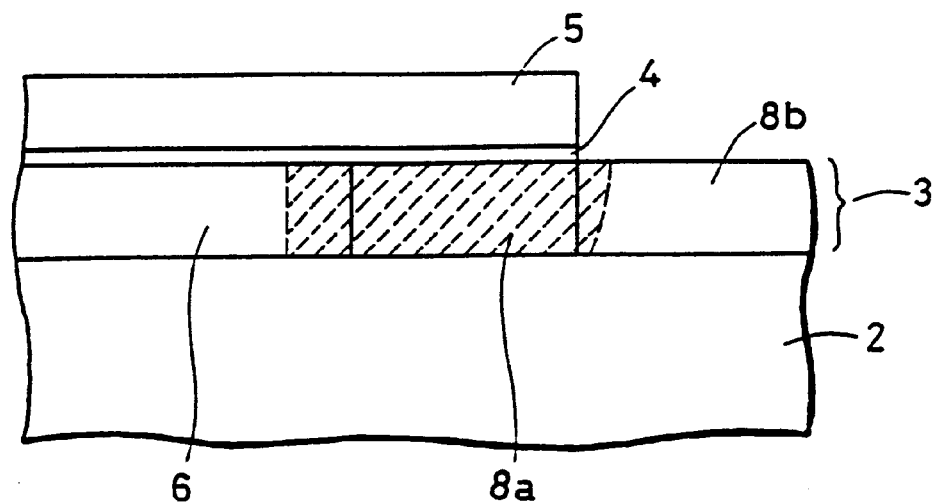
FIGS. 7A, 7B and 7C are typical sectional views illustrating the state of depletion of it in the non-operation state of a gate overlap-type thin film SOI-MOSFET.
Figure 7B:
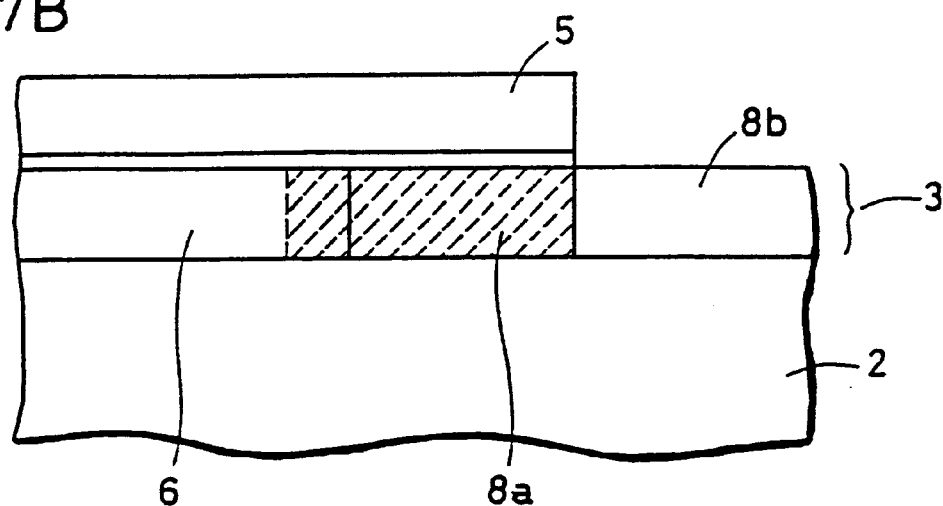
Figure 9:
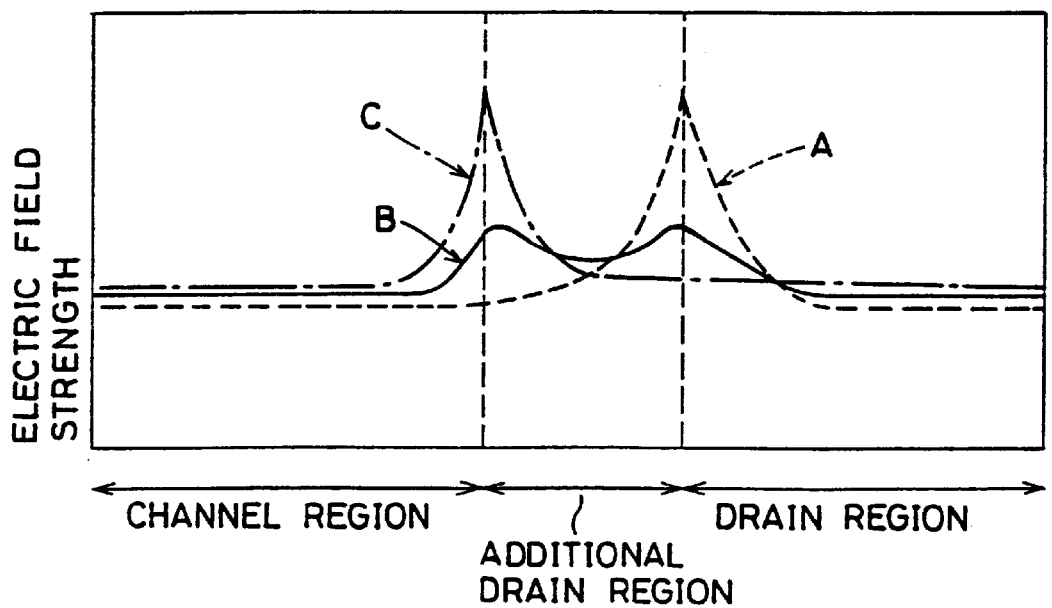
FIG. 9 is a graph showing distribution of electric strength in the vicinity of an additional drain region corresponding respectively to FIGS. 7A, 7B and 7C.

If the concentration of additional drain region 8a is of a predetermined value of approximately $10^{18}$ $cm^3$, additional drain region 8a is depleted completely as indicated by oblique lines in FIG. 7B, and the peak of electric field strength is distributed in the vicinity of the both ends of additional drain region 8a as indicated by arrow B in FIG. 9, and the value of it becomes low.

Figure 7C:
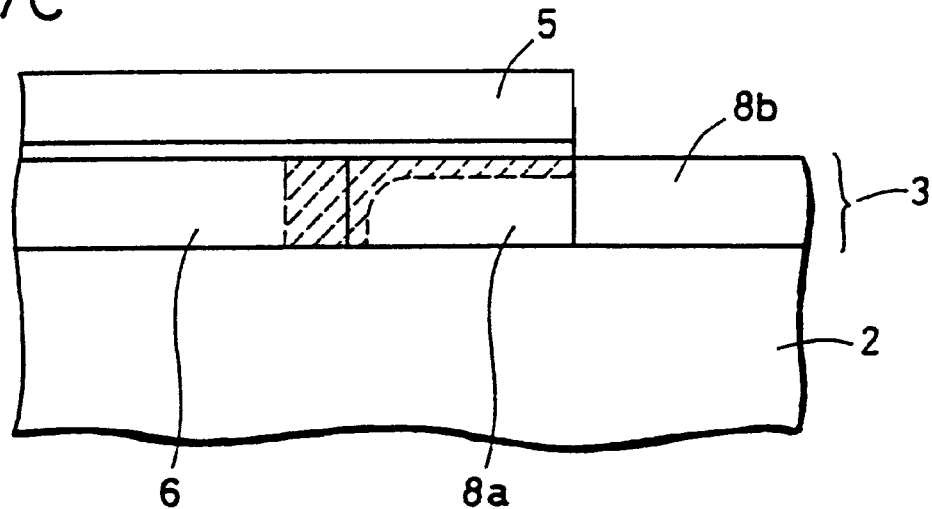

In addition, in a case where the concentration of additional drain region 8a is higher than a predetermined value of approximately $10^{18}/cm^3$, depletion of additional drain region 8a proceeds only a little as illustrated by oblique lines in FIG. 7C, and therefore the field reduction effect in additional drain region 8a is insufficient, and a high peak of electric strength occurs in the vicinity of its left end as indicated by arrow C in FIG. 9.

Figure 8:
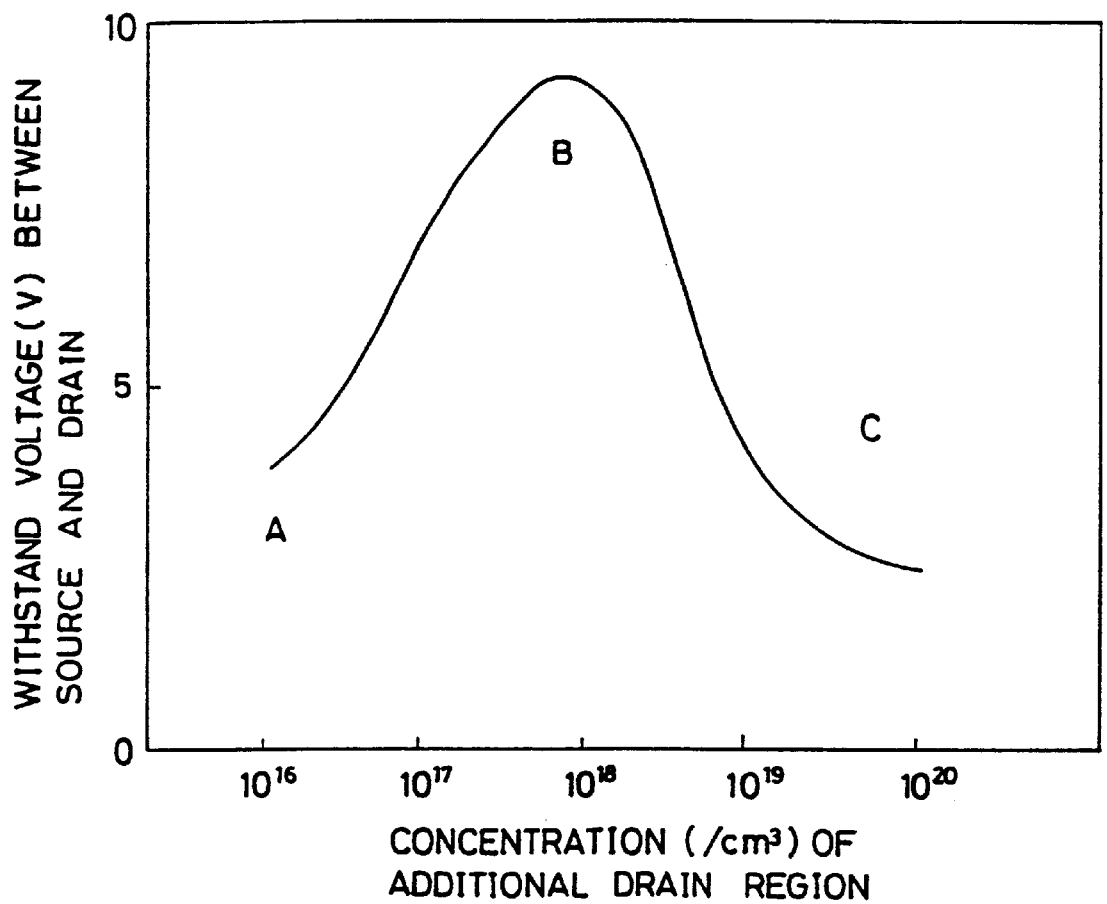
FIG. 8 is a graph showing the relationship between the concentration of an additional drain region of a thin film SOI-MOSFET and the withstand voltage between the source and the drain.

As seen from above results of consideration, the withstand voltage between the source and the drain of the SOI-MOSFET according to this embodiment becomes optimum when the concentration of additional drain region 8a is set to approximately $10^{18}$ as shown by the graph in FIG. 8, and the withstand voltage between the source and the drain is lowered if the concentration is higher or lower than that. The graph in FIG. 8 shows the relationship between the concentration of additional drain region 8a and the withstand voltage between the source and the drain in a case where the length of gate electrode 5 is 0.3 $\mu$m, the thickness of silicon layer 3 is 300 Å, and the thickness of gate insulating film 4 is 200 Å.

Figure 10A:
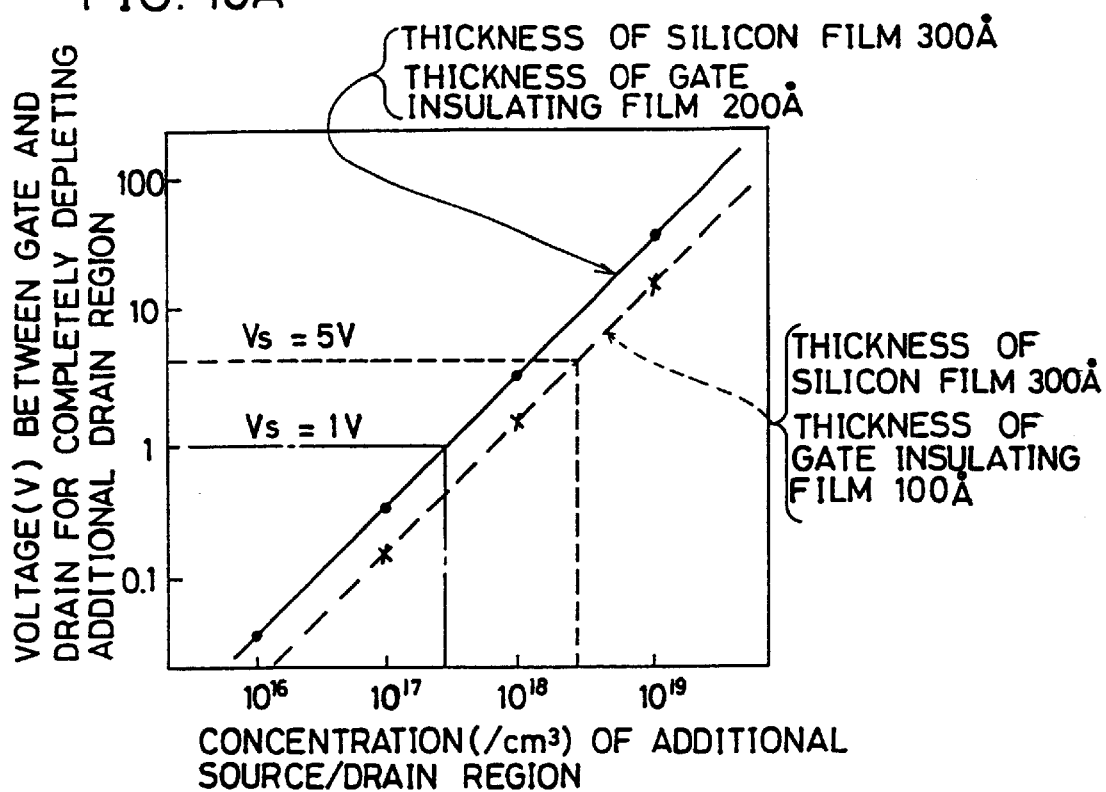
FIGS. 10A and 10B are graphs showing the relationship between the concentration of additional source/drain regions of a thin film SOI-MOSFET and the voltage between the gate and the drain causing the additional drain region to be depleted completely in the case where the thickness of a silicon film is 300 Å and in the case where it is 1000 Å.
Figure 10B:
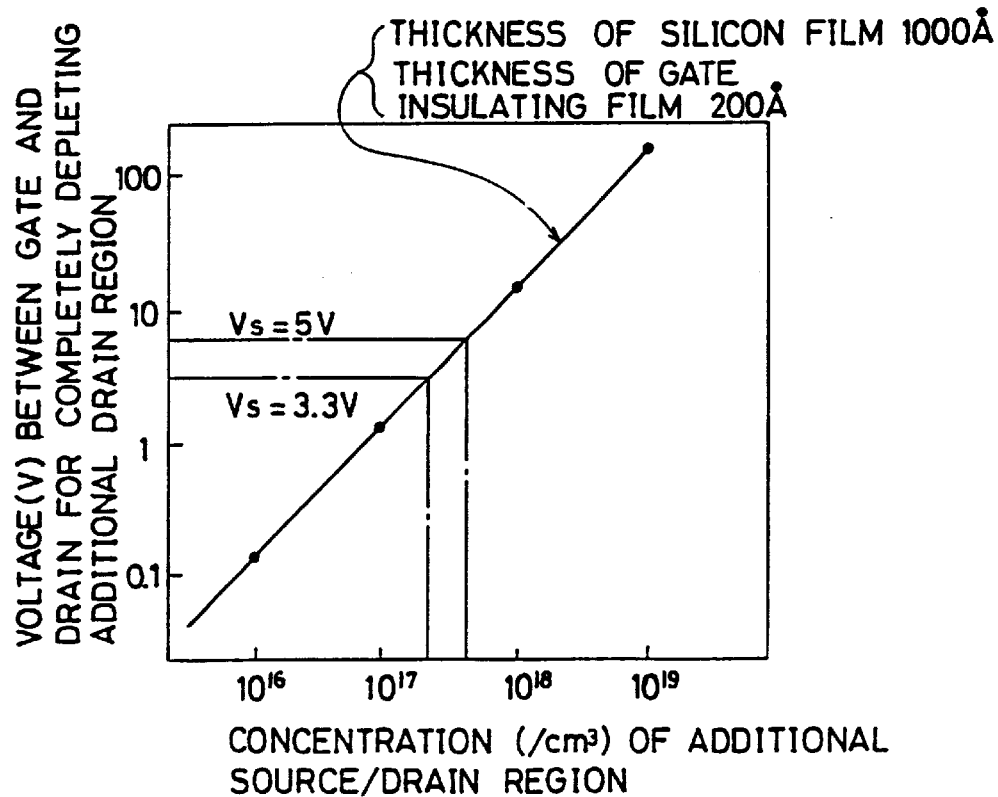

Now, the relationship between the thickness of silicon layer 3 and the optimum concentration of additional drain region 8a, i.e. conditions for depleting completely additional drain region 8a will be considered. In a case where the thickness of silicon layer 3 is 300 Å, in order to be adapted to a device structure in which the length of gate electrode 5 is shorter than 0.3 $\mu$m (so-called 0.3 $\mu$m design rule), additional drain region 8a must have an impurity concentration of approximately $3\times10^{17}$–$3\times10^{18}/cm^3$, because the supply voltage (the applied voltage to drain region 8b) is normally 1–5V, and the thickness of gate insulating film 4 is 100 Å–200 Å (See FIG. 10A). On the other hand, in a case where the thickness of silicon layer 3 is 1000 Å, the gate electrode length becomes approximately 0.5 $\mu$m (so-called 0.5 $\mu$m design rule), and the supply voltage (the applied voltage to drain region 8b) normally becomes 3.3–5V. In this case, in order to deplete completely additional drain region 8a, it is necessary to set the impurity concentration to approximately $3\times10^{17}$–$5\times10^{17}/cm^3$ (See FIG. 10B). In a case where the thickness of the silicon layer is above 300 Å and below 1000 Å, it may be considered that it is in the middle condition of the above cases.

It is seen from the above description that the concentration of additional source/drain regions 7a, 8a of a thin film SOI-MOSFET including silicon layer 3 having a thickness of approximately 300 Å–1500 Å must be set in the range of $3\times10^{17}$–$3\times10^{18}/cm^3$.

Now, an embodiment of a method of manufacturing a semiconductor device including a gate overlap-type LDD MOSFET having the above structure will be described with reference to FIGS. 5A to 5E.

Figure 5A:
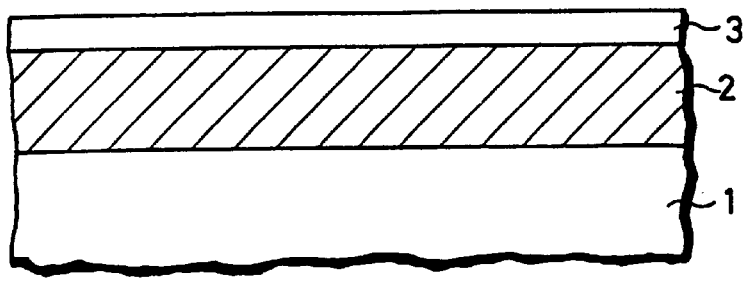
FIGS. 5A, 5B, 5C, 5D and 5E are sectional views illustrating in sequence main steps of method of manufacturing a semiconductor device according to an embodiment of the present invention.

First, referring to FIG. 5A, a silicon layer 3 as a semiconductor device is formed to have a thickness of 300Å–1500 Å on a silicon substrate 1 with an insulator layer 2 interposed therebetween. Formation of insulator layer 2 is carried out by a SIMOX process in the same way as in the above first conventional example.

Figure 5B:
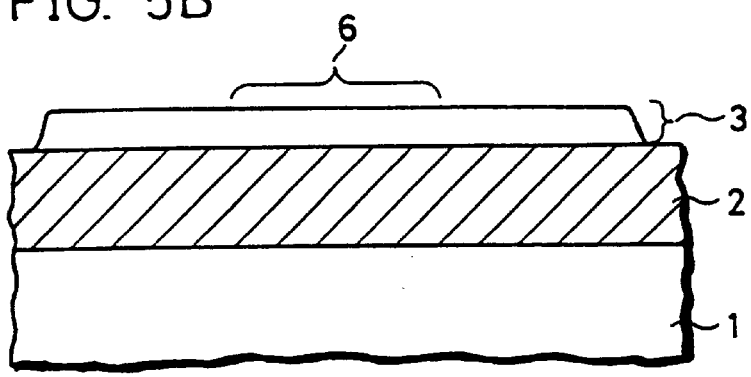

Next, silicon layer 3 is processed into a shape of an island and p-type impurities such as boron are implanted to make the concentration $10^{16}$–$10^{17}/cm^3$, for example, using an ion implantation process or the like to form a channel forming region 6 (FIG. 5B).

Figure 5C:
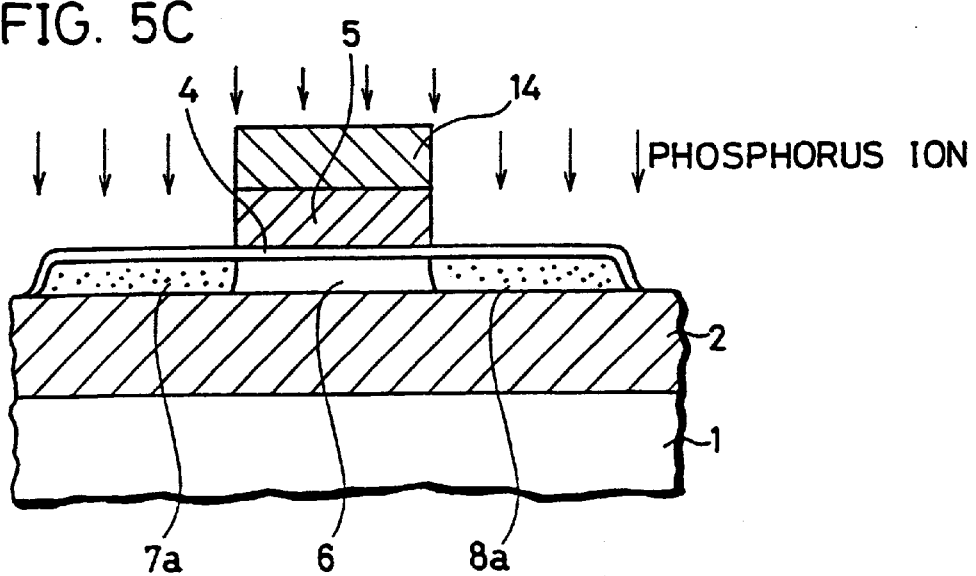

Next, a gate insulating film 4 is formed on silicon layer 3 to have a thickness of approximately 200 Å using a thermal oxidation process or the like, and then a layer of a gate electrode material such as polycrystalline silicon or the like is formed to have a thickness of approximately 2000 Å using a CVD method or the like. A resist 14 is patterned on the polycrystalline silicon layer using a photolithography process, and the polycrystalline layer is etched using this as a mask to form a gate electrode 5. Next, n-type impurities such as phosphorus ions are ion-implanted using gate electrode 5 as a mask to form an additional source region 7a and an additional drain region 8a having a concentration of $3\times10^{17}$–$3\times10^{18}/cm^3$ (FIG. 5C). At this time, in a case where phosphorus is used as the impurities to be implanted and the thickness of silicon layer 3 is approximately 1000 Å, implantation energy of approximately 30 KeV and a dosage of $3\times10^{13}$–$3\times10^{14}/cm^3$ are employed as ion implantation conditions for setting them to have the above concentration.

Figure 5D:
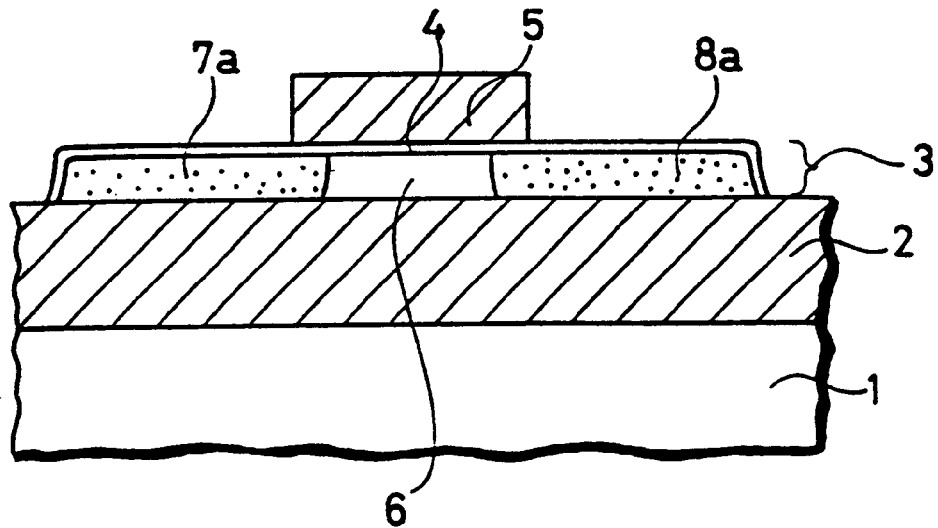

Next, predetermined heat treatment is carried out, and thermal diffusion causes additional source region 7a, additional drain region 8a to move from immediately beneath the left and right side ends of gate electrode 5 inward (FIG. 5D). A heat treatment condition for thermal diffusion in this case is that in the case where the thickness of silicon layer 3 is approximately 1000 Å, heat treatment is carried out in a nitrogen atmosphere at approximately 1000° C. for about one hour, so that thermal diffusion causes additional source region 7a and additional drain region 8a to move from immediately beneath the left and right side ends of gate electrode 5 inward by approximately 1500 Å.

Figure 5E:
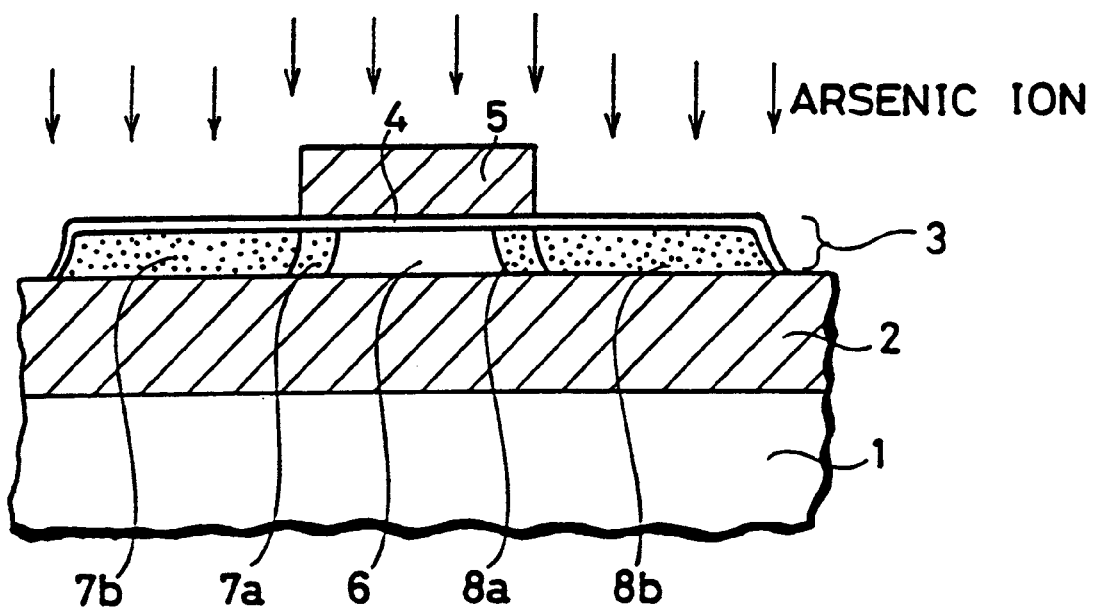

Next, n-type impurities such as phosphorus ions or arsenic ions are implanted into silicon layer 3 using gate electrode 5 as a mask to form a source region 7b and a drain region 8b having a concentration of approximately $10^{19}$–$10^{20}/cm^3$ (FIG. 5E).

Subsequently, an interlayer insulating film (not shown) is deposited on the whole surface of silicon substrate 1, contact holes (not shown) are formed, and an interconnection layer (not shown) of aluminum or the like is formed to complete a thin film SOI-MOSFET having the same structure as the structure illustrated in FIG. 3E.

Figure 6A:
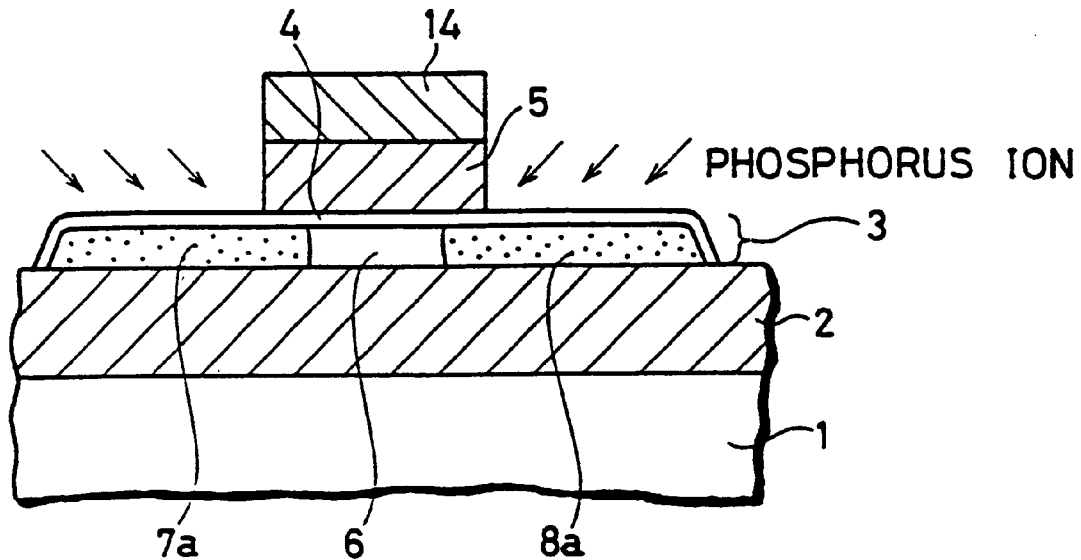
FIGS. 6A and 6B are sectional views illustrating main steps of a method of manufacturing a semiconductor device according to another embodiment of the present invention.
Figure 6B:
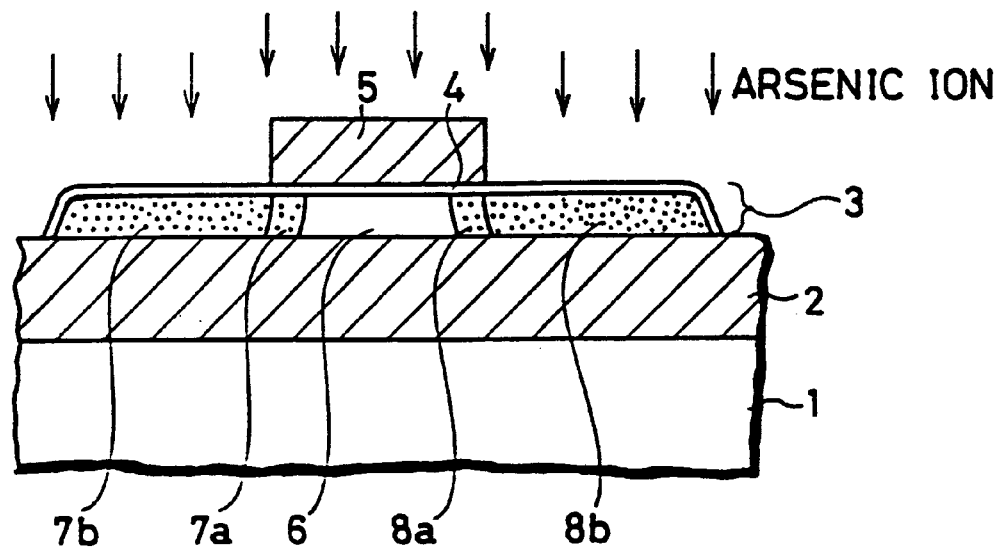

Now, another embodiment of a method of manufacturing a semiconductor device including a thin film SOI-MOSFET of a gate overlap-type LDD structure will be described with reference to FIGS. 6A and 6B.

According to this embodiment, the steps up to the step of forming a silicon layer 3 as a semiconductor layer in a shape of an island are the same as those of the above embodiment illustrated in FIGS. 5A and 5B. This embodiment differs from the above embodiment in that formation of additional source region 7a and additional drain region 8a is carried out by irradiating ions, phosphorus ions, for example, from a direction making a predetermined angle of inclination with the surface of silicon layer 3, i.e. by using a so-called oblique ion implantation process as illustrated in FIG. 6A, so that the vicinity of the end of gate electrode 5 overlaps with additional source region 7a and additional drain region 8a. According to the oblique ion implantation process, ion implantation is carried out with silicon substrate 1 rotating in a plane parallel to its surface at a constant speed in order to form a pair of additional source region 7a and additional drain region 8a on the left and right hands. In a case where the thickness of silicon layer 3 is approximately 1000 Å and phosphorus ions are used as the impurities to be implanted, for setting the concentration of additional source region 7a and additional drain region 8a to $3 \times 10^{17}$–$3 \times 10^{18}/cm^3$, ion implantation conditions are that the implantation energy is approximately 80 KeV, the angle of inclination made between the ion irradiation direction and the direction of the normal of silicon layer 3 is approximately 60 degrees, and the dosage is $1.2 \times 10^{13}$–$1.2 \times 10^{14}/cm^2$. These implantation conditions cause additional source region 7a and additional drain region 8a to move from both of the left and right side ends of the gate electrode inward by approximately 1500 Å.

Next, photo resist 14 is removed, and arsenic ions, for example, are implanted from the direction perpendicular to the surface of silicon layer 3 using gate electrode 5 as a mask as in the case of the above embodiment (FIG. 5E) to form a source region 7b and a drain region 8b having a concentration of $10^{19}$–$10^{20}/cm^3$.

While ion implantation is carried out with silicon substrate 1 rotating for forming additional source region 7a and additional drain region 8a in this embodiment, it is possible to form them by carrying out ion implantation diagonally from the upper hand of one sidewall of gate electrode 5 with a predetermined angle of inclination keeping silicon substrate 1 still to form one of additional source region 7a and additional drain region 8a, and then rotating silicon substrate 1 by 90 degrees in a plane parallel to its surface, fixing it, and carrying out ion implantation to form the other one of additional drain region 8a and additional source region 7b. However, this method can be used only in the cases where a number of SOI-MOSFET elements on a silicon wafer are aligned in the same direction.

As described above, according to the structure of the semiconductor device of the above embodiment, the concentration of additional source/drain regions 7a, 8a overlapping with gate electrode 5 is set to $3 \times 10^{18}/cm^3$ or less in the thin film SOI-MOSFET, so that additional source/drain regions 7a, 8a are depleted completely in the non-operation state of the MOSFET, the peak of electric field strength is dispersed, and its value is reduced, and satisfactory source/drain withstand voltage characteristics can be obtained. In addition, since it has a gate overlap structure, the current driving characteristics in the operation state of the MOSFET is also kept satisfactory, and it is also possible to obtain fine transistor characteristics. If the concentration of additional source/drain regions 7a, 8a is set to less than $3 \times 10^{17}/cm^3$, the parasitic resistance thereof is increased so that the properties of the device become worse.

According to an embodiment of a method of manufacturing a semiconductor device of the present invention, the additional source/drain regions and the source/drain regions are formed using only the gate electrode as a mask, so that it is possible to form a SOI-MOSFET having a gate overlap-type LDD structure by a relatively simple process.

Furthermore, according to another embodiment of a method of manufacturing a semiconductor device of the present invention, the additional source/drain regions are formed by using an oblique ion implantation process, so that it is possible to control the length of the gate overlap and the concentration of the additional source/drain regions with higher precision as compared to the case where a thermal diffusion step is included.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a semiconductor layer, having a surface, on an insulator;

forming a gate insulating film on said semiconductor layer;

forming a gate electrode on said gate insulating film;

introducing impurities of a conductivity type immediately beneath and in proximity to ends of said gate electrode in said semiconductor layer by ion implantation at an angle of inclination with the surface of said semiconductor layer using said gate electrode as a mask to form first source/drain regions which extend from the surface of said semiconductor layer to said insulation layer; and implanting impurities of the same conductivity type as that of the impurities implanted into said first source/drain regions from a direction perpendicular to the surface of said semiconductor layer into said semiconductor layer using said gate electrode as a mask to form second source/drain regions.

2. The method of manufacturing a semiconductor device according to claim 1, wherein said step of forming said semiconductor layer on said insulator includes the step of implanting oxygen ions into a main surface of a silicon substrate for forming a silicon oxide film as buried to be said insulator, with a silicon layer having the thickness of 300 Å to 1500 Å left from the main surface of said silicon substrate.

3. The method of manufacturing a semiconductor device according to claim 1, wherein said step of forming said semiconductor layer on said insulator includes the steps of;

forming a silicon layer in a shape of an island on said insulator, and implanting impurities of a second conductivity type into said silicon layer.

4. The method of manufacturing a semiconductor device according to claim 3, wherein said step of implanting impurities of the second conductivity type on said silicon layer includes the step of implanting boron to make the concentration $10^{16}$ to $10^{17}/cm^3$.

5. The method of manufacturing a semiconductor device according to claim 1, wherein phosphorus is implanted in said step of forming said first source/drain regions, and phosphorus or arsenic is implanted to make the concentration $10^{19}$ to $10^{20}/cm^3$ in said step of forming said second source/drain regions.

6. The method of manufacturing a semiconductor device according to claim 1, wherein said step of forming said first source/drain regions includes the step of implanting impurities of said conductivity type at an angle of inclination with the surface of said semiconductor layer with said semiconductor layer rotated continuously in a plane parallel to its surface.

7. The method of manufacturing a semiconductor device according to claim 1, wherein
   said step of forming said first source/drain regions includes;
   a first step of implanting impurities of said conductivity type from at an angle of inclination with the surface of said semiconductor layer with said semiconductor layer kept still, and
   a second step of rotating said semiconductor layer by 180° relatively to said direction of implanting impurities of said conductivity type in a plane parallel to its surface, and then implanting impurities of said conductivity type again at the same angle of indignation as in said first step with said semiconductor layer kept still.

8. The method of manufacturing a semiconductor device according to claim 1, comprising controlling the conditions of the steps of implanting impurities for forming said first source/drain regions and said source/drain regions so that said first source/drain regions may be completely depleted without depletion of said second source/drain regions in a non-operation state of the field effect transistor constituted by said gate electrode, said second source/drain regions and said additional source/drain regions.

9. A method of manufacturing a semiconductor device comprising the steps of sequentially:
   forming a semiconductor layer having a surface on an insulator;
   forming a gate insulating film on said semiconductor layer;
   forming a gate electrode on said gate insulating film;
   introducing impurities of a first conductivity type by ion implantation using said gate electrode as a mask;
   diffusing the implanted impurities of the first conductivity type beneath said gate electrode by heat treatment to form first source/drain regions which extend from the surface of said semiconductor layer to said insulation layer; and
   implanting impurities of said first conductivity type into said semiconductor layer using said gate electrode as a mask to form second source/drain regions.

10. The method of manufacturing a semiconductor device according to claim 9, wherein said step of forming said semiconductor layer on said insulator includes the step of implanting oxygen ions into a main surface of a silicon substrate for forming a silicon oxide film as buried to be said insulator, with a silicon layer having the thickness of 300 Å to 1500 Å left from the main surface of said silicon substrate.

11. The method of manufacturing a semiconductor device according to claim 9, wherein
    said step of forming said semiconductor layer on said insulator includes the steps of;
    forming a silicon layer in a shape of an island on said insulator, and
    implanting impurities of a second conductivity type into said silicon layer.

12. The method of manufacturing a semiconductor device according to claim 11, wherein said step of implanting impurities of the second conductivity type onto said silicon layer includes the step of implanting boron to make the concentration $10^{16}$ to $10^{17}/cm^3$.

13. The method of manufacturing a semiconductor device according to claim 9, wherein said heat treatment in said step of forming said first source/drain regions is carried out in an nitrogen atmosphere at substantially 1000° C.

14. The method of manufacturing a semiconductor device according to claim 9, wherein phosphorus is implanted in said step of forming said first source/drain regions, and phosphorus or arsenic is implanted to make the concentration $10^{19}$ to $10^{20}/cm^3$ in said step of forming said second source/drain regions.

15. The method of manufacturing a semiconductor device according to claim 9, comprising controlling the conditions of said steps of introducing impurities of said first conductivity type and diffusing the implanted impurities by heat treatment for forming said first source/drain regions and the conditions of said step of implanting impurities of said first conductivity type for forming said second source/drain regions so that said first source/drain regions may be completely depleted without depletion of said source/drain regions in a non-operation state of the field effect transistor constituted by said gate electrode, said second source/drain regions and said first source/drain regions.

* * * * *